United States Patent
Volpp et al.

(10) Patent No.: US 8,197,928 B2
(45) Date of Patent: Jun. 12, 2012

(54) INTRUSION RESISTANT SAFETY GLAZINGS AND SOLAR CELL MODULES

(75) Inventors: Willi Volpp, Herzogenrath (DE); Luc A. Moeyersons, Wingaardstraat (BE); Ingo Kueppenbender, Welver (DE); Richard Allen Hayes, Beaumont, TX (US)

(73) Assignee: E. I. du Pont de Nemours and Company, Wilmington, DE (US)

( * ) Notice: Subject to any disclaimer, the term of this patent is extended or adjusted under 35 U.S.C. 154(b) by 263 days.

(21) Appl. No.: 12/005,693

(22) Filed: Dec. 28, 2007

(65) Prior Publication Data

US 2008/0210287 A1  Sep. 4, 2008

Related U.S. Application Data

(60) Provisional application No. 60/877,859, filed on Dec. 29, 2006.

(51) Int. Cl.
*H01L 31/042* (2006.01)
*H01L 31/04* (2006.01)
*B32B 27/30* (2006.01)
*B32B 37/00* (2006.01)
*B32B 38/00* (2006.01)
*B32B 17/10* (2006.01)

(52) U.S. Cl. ........ 428/220; 428/411.1; 136/244; 136/252; 156/285; 156/60; 156/64

(58) Field of Classification Search ........... 136/244, 136/252; 156/60, 64, 252, 285; 420/98, 420/220, 411.1
See application file for complete search history.

(56) References Cited

U.S. PATENT DOCUMENTS

| | | | |
|---|---|---|---|
| 3,957,537 A | 5/1976 | Baskett et al. | |
| 4,249,958 A | 2/1981 | Baudin et al. | |
| 4,321,418 A | 3/1982 | Dran et al. | |
| 5,059,254 A | 10/1991 | Yaba et al. | |
| 5,508,205 A | 4/1996 | Dominguez et al. | |
| 5,582,653 A | 12/1996 | Kataoka et al. | |
| 5,618,863 A * | 4/1997 | D'Errico et al. | 524/91 |
| 5,656,098 A | 8/1997 | Ishikawa et al. | |
| 5,728,230 A | 3/1998 | Komori et al. | |
| 6,075,202 A | 6/2000 | Mori et al. | |
| 6,288,323 B1 | 9/2001 | Hayashi et al. | |

(Continued)

FOREIGN PATENT DOCUMENTS

DE  4337694 A1  5/1995

(Continued)

OTHER PUBLICATIONS

European Search Report and Non-Binding European Search Opinion for European Application No. 07124181.4-2124 dated Apr. 23, 2008.

(Continued)

*Primary Examiner* — David Sample
*Assistant Examiner* — Tahseen N Khan
(74) *Attorney, Agent, or Firm* — Maria M. Kourtakis; Kelly Law Registry

(57) ABSTRACT

Described certain plasticized poly(vinyl butyral) (PVB) interlayer sheets that may be used to produce safety glass and solar cell laminates having enhanced penetration resistance and adequate adhesion levels. In particular, the stress value of these interlayer sheets at an elongation of 120% is preferably in the range of from about 8 to about 15 N/mm$^2$.

24 Claims, 1 Drawing Sheet

U.S. PATENT DOCUMENTS

| | | |
|---|---|---|
| 6,288,326 B1 | 9/2001 | Hayashi et al. |
| 6,538,192 B1 | 3/2003 | Coster et al. |
| 6,599,630 B1 | 7/2003 | Fugiel et al. |
| 6,777,610 B2 | 8/2004 | Yamada et al. |
| 6,822,157 B2 | 11/2004 | Fujioka |
| 6,940,008 B2 | 9/2005 | Shiotsuka et al. |
| 6,982,296 B2 | 1/2006 | Keller et al. |
| 2004/0191422 A1 | 9/2004 | Kataoka et al. |
| 2005/0079363 A1 | 4/2005 | Hoss et al. |
| 2005/0234185 A1 | 10/2005 | Smith |
| 2005/0256258 A1 | 11/2005 | Keller |
| 2005/0279401 A1* | 12/2005 | Arhart et al. ............ 136/251 |
| 2005/0284516 A1* | 12/2005 | Koll ........................ 136/251 |
| 2006/0110590 A1 | 5/2006 | Phillips |
| 2007/0235077 A1 | 10/2007 | Nagata et al. |

FOREIGN PATENT DOCUMENTS

| | | |
|---|---|---|
| EP | 0 185 863 B1 | 7/1986 |
| EP | 0 343 628 B1 | 11/1989 |
| EP | 0 631 328 B1 | 12/1994 |
| EP | 0 769 818 A2 | 4/1997 |
| EP | 1 005 096 A2 | 5/2000 |
| EP | 1 054 456 A2 | 11/2000 |
| EP | 1 182 710 B1 | 2/2002 |
| EP | 1 235 683 B1 | 9/2002 |
| EP | 1995789 A1 | 11/2008 |
| JP | 05-082819 | 4/1993 |
| JP | 2001-053298 | 2/2001 |
| JP | 2005-123452 | 5/2005 |
| JP | 2005-129565 | 5/2005 |
| JP | 2006-073707 | 3/2006 |
| JP | 2008-115344 A | 5/2008 |
| WO | WO 91/01880 | 2/1991 |
| WO | WO 96/28504 | 9/1996 |
| WO | WO 01/43963 A1 | 6/2001 |
| WO | WO 02/26492 A1 | 4/2002 |
| WO | WO 03/057478 A1 | 7/2003 |
| WO | WO 2004/039581 A1 | 5/2004 |
| WO | 2009-071703 A2 | 6/2009 |

OTHER PUBLICATIONS

Cuddihy et al, Applications of Ethylene Vinyl Acetate as an Encapsulation Material for Terrestrial Photovoltaic Modules, Jet Propulsion Laboratory Publication 83-35, 1983, pp. 1-71, Jet Propulsion Laboratory, Pasadena, California.

* cited by examiner

US 8,197,928 B2

INTRUSION RESISTANT SAFETY GLAZINGS AND SOLAR CELL MODULES

CROSS-REFERENCE TO RELATED APPLICATION

The present application claims priority to U.S. Provisional Appln. No. 60/877,859, filed on Dec. 29, 2006, which is incorporated herein by reference in its entirety.

FIELD OF THE INVENTION

The present invention relates to certain polymeric interlayer sheets, and to glass laminates and solar cell laminates comprising the same. In particular, the glass and solar cell laminates have superior penetration resistance.

BACKGROUND OF THE INVENTION

Several patents and publications are cited in this description in order to more fully describe the state of the art to which this invention pertains. The entire disclosure of each of these patents and publications is incorporated by reference herein.

Glass laminated products have contributed to society for almost a century. Beyond the well known, every day automotive safety glass used in windshields, laminated glass is used in all forms of the transportation industry. It is utilized as windows for trains, airplanes, ships, and nearly every other mode of transportation. Safety glass is characterized by high impact and penetration resistance and does not significantly scatter glass shards and debris when shattered.

Safety glass typically features a sandwich of two sheets or panels of glass bonded together with an interlayer of a polymeric sheet in between. One or both of the glass sheets may be replaced with optically clear rigid polymeric sheets, such as sheets of polycarbonate materials. Safety glass has further evolved to include multiple layers of glass and/or rigid polymeric sheets bonded together with interlayers of polymeric sheets.

The interlayer is typically made with a relatively thick polymer sheet, which exhibits toughness and bondability to provide adhesion to the glass in the event of a crack or crash. Over the years, a wide variety of polymeric interlayers have been developed to produce laminated products. In general, these polymeric interlayers must possess a combination of characteristics including very high optical clarity, low haze, high impact resistance, high penetration resistance, excellent ultraviolet light resistance, good long term thermal stability, excellent adhesion to glass and other rigid polymeric sheets, low ultraviolet light transmittance, low moisture absorption, high moisture resistance, and excellent long term weatherability, among other requirements. Widely used interlayer materials include complex, multicomponent compositions based on poly(vinyl butyral) (PVB), polyurethane (PU), polyvinylchloride (PVC), metallocene-catalyzed linear low density polyethylenes, ethylene-co-vinyl acetate (EVA), polymeric fatty acid polyamides, polyester resins, such as poly(ethylene terephthalate), silicone elastomers, epoxy resins, elastomeric polycarbonates, ethylene acid copolymers, ionomers and the like.

Architectural and automotive glazings are being constantly upgraded to withstand manmade and natural threats. Threat resistance may be demonstrated through many test protocols, such as the standards EN 12600, EN 1063 and EN 356 (European Committee for Standardization) in Europe for different impact types and assemblies of glass panels and interlayers. They define penetration resistance to impacting bodies with various levels of kinetic energy with defined glazing types. The most common test protocol is EN 356 P2A glazing, which involves a glass laminate consisting of two panels of 4 mm glass bonded by a 0.76 mm thick polymeric interlayer. Each of three (3) 1100 mm by 900 mm glass laminates with this construction is placed in a horizontal position to receive a 4.1 kg ball falling from a height of 3 m and the laminate is considered to have passed the test if no penetration is observed in any of the three (3) laminates tested.

A shortcoming of the interlayer sheets currently used in intrusion resistant glass laminates, which meet the EN 356 P2A standard, is that they typically possess a reduced glass adhesion, and therefore do not provide all of the safety aspects commonly associated with safety glass.

Solar cell modules or laminates, also referred to as photovoltaic modules, are units that convert light energy into electrical energy that can be useful for powering machinery, electrical equipment and appliances, for example. As a renewable energy resource, the use of solar cell modules is rapidly expanding.

In recent years, solar cell modules have become much more complex and demand enhanced functionality of the encapsulant materials incorporated therein. Encapsulant layers used in solar cell modules generally have requirements and compositions that are similar to those described above for glazing interlayers. For example, poly(vinyl butyral) compositions have commonly been disclosed as encapsulant layers for solar cell modules (see, e.g., U.S. Pat. Nos. 3,957,537; 4,249,958; 4,321,418; 5,508,205; 5,582,653; 5,728,230; 6,075,202; 6,288,323; 6,288,326; 6,538,192; 6,777,610; 6,822,157; 6,940,008, U.S. Patent Application Nos. 2004/0191422 and 2005/0284516, and European Patent Nos. EP 0 343 628, EP 0 631 328, EP 1 005 096, and EP 1 054 456).

Similarly, then, a shortcoming of the encapsulant materials used in solar cell modules is that they usually do not meet both the EN 356 P2A standard and the desired level of glass adhesion which is a safety aspect commonly associated with safety glass.

Conventional construction of a solar cell module features at least 5 structural layers. It is typically constructed in the following order starting from the top, or incident layer (that is, the layer first contacted by light) and continuing to the backing (the layer furthest removed from the incident layer): (1) incident layer; (2) front-sheet (first) encapsulant layer; (3) voltage-generating (solar cell) layer; (4) back-sheet (second) encapsulant layer; and (5) backing layer. The function of the incident layer is to provide a transparent protective window that will allow sunlight to be transmitted into the solar cell(s). The incident layer is typically a glass plate or a thin polymeric film (such as a fluoropolymer or polyester film), but could conceivably be any material that is transparent to sunlight. The encapsulant layers are designed to encapsulate and protect the fragile solar cell layer. Generally, a solar cell module will incorporate at least two encapsulant layers sandwiched around the solar cell layer. The optical properties of the front-sheet encapsulant layer must be such that light can be effectively transmitted to the solar cell layer.

The present invention overcomes these shortcomings by providing glazing interlayers and solar cell encapsulant layers tailored to provide improved intrusion resistance along with desired glass adhesion.

SUMMARY OF THE INVENTION

Described herein is an interlayer sheet comprising a poly (vinyl butyral) (PVB) composition containing about 20 to about 26 wt % of triethylene glycol di-2-ethylhexanoate plasticizer, wherein a) said PVB interlayer sheet has a pummel value equal to or greater than about 1, and a compressive shear strength greater than or equal to about 1000 psi, and b) said PVB interlayer sheet provides glass laminates which pass EN 356 P2A test; and which optionally further has one or more characteristics selected from the group consisting of a compressive shear strength of about 1000 to about 2500 psi; a pummel value of about 2 to about 7; an E50 value greater than or equal to 300 psi; an E120 value of about 8 to about 15 N/mm$^2$; and a thickness of about 20 to about 45 mils.

Also provided are glass laminates and solar cell laminates comprising the interlayer sheet, methods of producing the solar cells, and methods of providing laminates that pass the EN 356 P2A test.

DETAILED DESCRIPTION OF THE INVENTION

Definitions

Figure 1A:
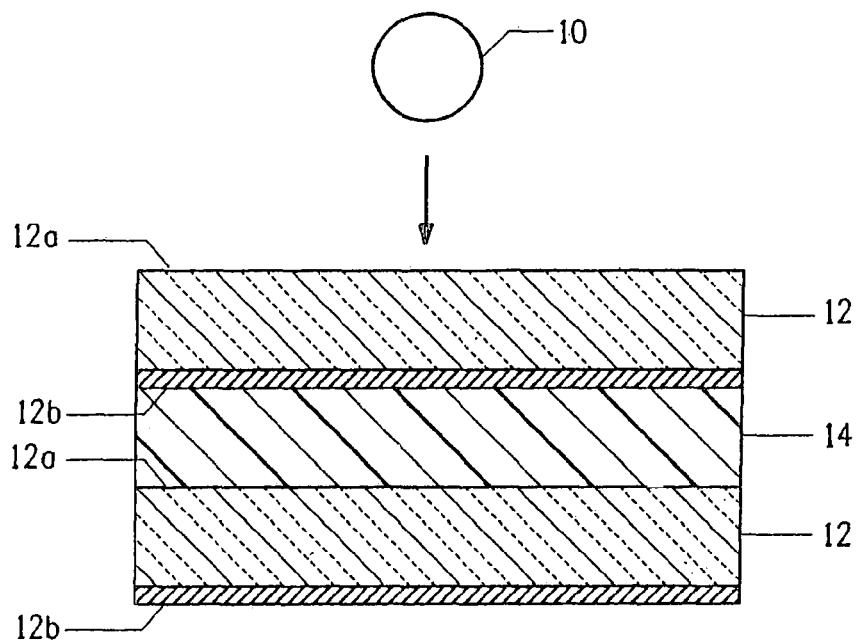
FIG. 1A is a cross-sectional view of the construction of an "ATAT" laminate in the course of a EN 365 P2A impact test.

The following definitions apply to the terms as used throughout this specification, unless otherwise limited in specific instances.

The technical and scientific terms used herein have the meanings that are commonly understood by one of ordinary skill in the art to which this invention belongs. In case of conflict, the present specification, including the definitions herein, will control. Tradenames are printed in uppercase lettering.

As used herein, the terms "comprises," "comprising," "includes," "including," "containing," "characterized by," "has," "having" or any other variation thereof, refer to a non-exclusive inclusion. For example, a process, method, article, or apparatus that comprises a given list of elements is not necessarily limited to only those elements given, but may further include other elements not expressly listed or inherent to such process, method, article, or apparatus.

The transitional phrase "consisting of" excludes any element, step, or ingredient not specified in the given list of elements, closing the list to the inclusion of materials other than those recited except for impurities ordinarily associated therewith. When the phrase "consists of" appears in a clause of the body of a claim, rather than immediately following the preamble, it limits only the element set forth in that clause; other elements are not excluded from the claim as a whole.

The transitional phrase "consisting essentially of" limits the scope of a claim to the specified materials or steps and those that do not materially affect the basic and novel characteristic(s) of the claimed invention. A 'consisting essentially of' claim occupies a middle ground between closed claims that are written in a 'consisting of' format and fully open claims that are drafted in a 'comprising' format. Optional additives as defined herein, at levels that are appropriate for such additives, and minor impurities are not excluded from a composition by the term "consisting essentially of".

When a composition, a process, a structure, or a portion of a composition, a process, or a structure, is described herein using an open-ended term such as "comprising," unless otherwise stated the description also includes an embodiment that "consists essentially of" or "consists of" the elements of the composition, the process, the structure, or the portion of the composition, the process, or the structure.

The articles "a" and "an" may be employed in connection with various elements and components of compositions, processes or structures described herein. This is merely for convenience and to give a general sense of the compositions, processes or structures. Such a description includes "one or at least one" of the elements or components. Moreover, as used herein, the singular articles also include a description of a plurality of elements or components, unless it is apparent from a specific context that the plural is excluded.

The term "or", as used herein, is inclusive; that is, the phrase "A or B" means "A, B, or both A and B". More specifically, a condition "A or B" is satisfied by any one of the following: A is true (or present) and B is false (or not present); A is false (or not present) and B is true (or present); or both A and B are true (or present). Exclusive "or" is designated herein by terms such as "either A or B" and "one of A or B", for example.

The terms "finite amount" and "finite value" refer to an amount that is greater than zero.

The term "about" means that amounts, sizes, formulations, parameters, and other quantities and characteristics are not and need not be exact, but may be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such.

In addition, the ranges set forth herein include their endpoints unless expressly stated otherwise. Further, when an amount, concentration, or other value or parameter is given as a range, one or more preferred ranges or a list of upper preferable values and lower preferable values, this is to be understood as specifically disclosing all ranges formed from any pair of any upper range limit or preferred value and any lower range limit or preferred value, regardless of whether such pairs are separately disclosed. The scope of the invention is not limited to the specific values recited when defining a range.

When materials, methods, or machinery are described herein with the term "known to those of skill in the art", "conventional" or a synonymous word or phrase, the term signifies that materials, methods, and machinery that are conventional at the time of filing the present application are encompassed by this description. Also encompassed are materials, methods, and machinery that are not presently conventional, but that will have become recognized in the art as suitable for a similar purpose.

All percentages, parts, ratios, and the like set forth herein are by weight, unless otherwise stated in specific instances.

As used herein, the term "copolymer" refers to polymers comprising copolymerized units resulting from copolymerization of two or more comonomers. In this connection, a copolymer may be described herein with reference to its constituent comonomers or to the amounts of its constituent comonomers, for example "a copolymer comprising ethylene and 9 weight % of acrylic acid", or a similar description. Such a description may be considered informal in that it does not refer to the comonomers as copolymerized units; in that it does not include a conventional nomenclature for the copolymer, for example International Union of Pure and Applied Chemistry (IUPAC) nomenclature; in that it does not use product-by-process terminology; or for another reason. As used herein, however, a description of a copolymer with reference to its constituent comonomers or to the amounts of its constituent comonomers means that the copolymer contains copolymerized units (in the specified amounts when specified) of the specified comonomers. It follows as a corollary that a copolymer is not the product of a reaction mixture containing given comonomers in given amounts, unless expressly stated in limited circumstances to be such.

Finally, in the present application, the terms "sheet" and "film" are used in their broad sense interchangeably. More specifically, although sheets and films are distinguished by their different thicknesses, in general the function of a layer in a laminate of the invention is determined by its composition, rather than by its thickness. Thus, a function that can be performed by a sheet of a particular composition may also be performed by a film of the same or similar composition, and vice versa. Those of skill in the art are aware that there may be variations in the efficiency of the performance of a particular function, resulting from changes in a layer's thickness.

Polymeric Films or Sheets

Disclosed herein are polymeric sheets suitable for use as interlayers in glass laminates or encapsulant layers in solar cell modules or laminates. These polymeric sheets possess excellent penetration resistance, and laminates formed from these sheets are characterized by adequate glass adhesion commonly associated with safety glass.

Preferably, the polymeric sheet of the present invention comprises a polymeric composition, and the polymeric composition comprises a poly(vinyl butyral). Thus, the polymeric composition may synonymously be referred to as a "poly(vinyl butyral) composition". Also preferably, the polymeric sheet can be heated and caused to form an adhesive bond with other laminate layer materials, such as flexible plastic materials, rigid materials, and/or the solar cell(s), for example.

Suitable poly(vinyl butyral) for use herein will typically have a weight average molecular weight ranging from about 30,000 to about 600,000 Da, preferably, from about 45,000 to about 300,000 Da, more preferably, from about 200,000 to about 300,000 Da, as measured by size exclusion chromatography using low angle laser light scattering. Preferred poly(vinyl butyral) materials comprise, on a weight basis, about 12% to about 23%, preferably, about 14% to about 21%, more preferably, about 15% to about 19.5%, and most preferably, about 15% to about 19%, of hydroxyl groups calculated as polyvinyl alcohol (PVOH). The hydroxyl number can be determined according to standard methods, such as ASTM D1396-92. In addition, the preferred poly(vinyl butyral) materials may incorporate 0 to about 10%, preferably, 0 to about 3%, of residual ester groups, calculated as polyvinyl ester, typically acetate groups, with the balance being butyraldehyde acetal. The poly(vinyl butyral) used herein may further comprises a finite amount of acetal groups other than butyral, e.g., 2-ethyl hexanal, as disclosed in U.S. Pat. No. 5,137,954.

Poly(vinyl butyral) resins can be produced by aqueous or solvent acetalization. In a solvent process, acetalization is carried out in the presence of sufficient solvent to dissolve the poly(vinyl butyral) formed and produce a homogeneous solution at the end of acetalization. The poly(vinyl butyral) is separated from the solution by precipitation of the solid particles with water, which are then washed and dried. Solvents used include lower aliphatic alcohols, such as ethanol. In an aqueous process, acetalization is carried out by (i) adding butyraldehyde to a water solution of poly(vinyl alcohol) at a temperature ranging from about 20° C. to about 100° C., (ii) in the presence of an acid catalyst, agitating the mixture to cause an intermediate poly(vinyl butyral) to precipitate in finely divided form, (iii) continuing the agitation while heating until the reaction mixture has proceeded to the desired end point, and (iv) followed by neutralization of the catalyst, separation, stabilization and drying of the poly(vinyl butyral) resins. For example, poly(vinyl butyral) resins can be produced as disclosed in U.S. Pat. Nos. 3,153,009 and 4,696,971.

The poly(vinyl butyral) composition used herein also comprises triethylene glycol di-2-ethylhexanoate as a plasticizer. The addition of the plasticizer in the composition determines the viscosity of the polymeric sheets produced therefrom. One or more other plasticizers may also be contained in the composition. Any suitable plasticizers known within the art may be used herein. Suitable plasticizers are described in U.S. Pat. Nos. 3,841,890; 4,144,217; 4,276,351; 4,335,036; 4,902,464; 5,013,779, and PCT Patent Application No. WO 96/28504, for example. Examples of commonly used plasticizers include esters of a polybasic acid or a polyhydric alcohol. Preferred plasticizers include diesters obtained by the reaction of triethylene glycol or tetraethylene glycol with aliphatic carboxylic acids having from 6 to 10 carbon atoms, diesters obtained from the reaction of sebacic acid with aliphatic alcohols having from 1 to 18 carbon atoms, oligoethylene glycol di-2-ethylhexanoate, tetraethylene glycol di-n-heptanoate, dihexyl adipate, dioctyl adipate, mixtures of heptyl and nonyl adipates, dibutyl sebacate, tributoxyethylphosphate, isodecylphenylphosphate, triisopropylphosphite, polymeric plasticizers such as the oil-modified sebacid alkyds, and mixtures of phosphates and adipates, and adipates and alkyl benzyl phthalates and mixtures thereof. More preferred plasticizers are triethylene glycol di-2-ethylhexanoate, tetraethylene glycol di-n-heptanoate, dibutyl sebacate, and mixtures thereof.

In another preferable embodiment, the present invention is a polymeric sheet comprising a plasticized poly(vinyl butyral) having from about 20 to about 26 wt % of triethylene glycol di-2-ethylhexanoate, based on the total weight of the poly(vinyl butyral) composition. Preferably, the plasticized poly(vinyl butyral) comprises from about 23 to about 26 wt %, or more preferably, from about 24 to about 25 wt %, of triethylene glycol di-2-ethylhexanoate, based on the total weight of the poly(vinyl butyral) composition.

An adhesion control additive for controlling the adhesive bond between the polymeric sheet and the glass rigid layer may also be used in the polymeric composition. Suitable adhesion control additives generally include alkali metal or alkaline earth metal salts of organic and inorganic acids. Preferable adhesion control additives are alkali metal or alkaline earth metal salts of organic carboxylic acids having from 2 to 16 carbon atoms. More preferable adhesion control additives are magnesium or potassium salts of organic carboxylic acids having from 2 to 16 carbon atoms. Specific examples of such adhesion control additives include, but are not limited to, potassium acetate, potassium formate, potassium propanoate, potassium butanoate, potassium pentanoate, potassium hexanoate, potassium 2-ethylbutylate, potassium heptanoate, potassium octanoate, potassium 2-ethylhexanoate, magnesium acetate, magnesium formate, magnesium propanoate, magnesium butanoate, magnesium pentanoate, magnesium hexanoate, magnesium 2-ethylbutylate, magnesium heptanoate, magnesium octanoate, magnesium 2-ethylhexanoate and the like and mixtures thereof. The adhesion control additives are typically used in the range of about 0.001 to about 0.5 wt % based on the total weight of the polymeric composition.

Further in this connection, the adhesion of a poly(vinyl butyral) to glass may also be affected by the cleanliness of the glass surface, the moisture level of the poly(vinyl butyral), and the conditions of the lamination process, e.g., the temperature, pressure and time of an autoclave cycle.

Surface tension controlling agents, such as Trans™ 290 or Trans™ 296 (available from the Trans-Chemco Company), or Q-23183™ (available from the Dow Chemical Company), may also be included in the polymeric composition.

The polymeric compositions may further incorporate an effective amount of a thermal stabilizer. Thermal stabilizers are well disclosed within the art. Any known thermal stabilizer may find utility within the polymeric film or sheet. Preferable general classes of thermal stabilizers include, but are not limited to, phenolic antioxidants, alkylated monophenols, alkylthiomethylphenols, hydroquinones, alkylated hydroquinones, tocopherols, hydroxylated thiodiphenyl ethers, alkylidenebisphenols, O-, N- and S-benzyl compounds, hydroxybenzylated malonates, aromatic hydroxybenzyl compounds, triazine compounds, aminic antioxidants, aryl amines, diaryl amines, polyaryl amines, acylaminophenols, oxamides, metal deactivators, phosphites, phosphonites, benzylphosphonates, ascorbic acid (vitamin C), compounds which destroy peroxide, hydroxylamines, nitrones, thiosynergists, benzofuranones, indolinones, and the like and mixtures thereof. More preferably, the thermal stabilizer is a bis-phenolic antioxidant, which have been found to be surprisingly suitable for preparing low color poly(vinyl butyral), especially when used in combination with the triethylene glycol di-2-ethylhexanoate plasticizer. Suitable specific bis-phenolic antioxidants include, but are not limited to, 2,2'-ethylidenebis(4,6-di-t-butylphenol), 4,4'-butylidenebis(2-t-butyl-5-methylphenol), 2,2'-isobutylidenebis(6-t-butyl-4-methylphenol), and 2,2'-methylenebis(6-t-butyl-4-methylphenol). Bis-phenolic antioxidants are commercially available under the tradename of Anox® 29, Lowinox® 22M46, Lowinox® 44B25, and Lowinox® 22IB46. The polymeric compositions of the present invention preferably incorporate from about 0.01 to about 10.0 wt %, or more preferably, from about 0.01 to about 5.0 wt %, or most preferably, from about 0.01 to about 1.0 wt %, of thermal stabilizers, based on the total weight of the composition.

The polymeric compositions may further incorporate an effective amount of one or more UV absorbers. UV absorbers are also well disclosed within the art. Any known UV absorber may find utility within the polymeric film or sheet. Preferable general classes of UV absorbers include, but are not limited to, benzotriazoles, hydroxybenzophenones, hydroxyphenyl triazines, esters of substituted and unsubstituted benzoic acids, and the like and mixtures thereof. The polymeric compositions preferably contain from about 0.05 to about 10.0 wt %, or more preferably, from about 0.05 to about 5.0 wt %, or most preferably, from about 0.05 to about 1.0 wt %, of UV absorbers, based on the total weight of the composition.

The polymeric compositions may further incorporate an effective amount of one or more hindered amine light stabilizers (HALS). HALS are well disclosed within the art. Generally, HALS are secondary, tertiary, acetylated, N-hydrocarbyloxy substituted, hydroxy substituted, N-hydrocarbyloxy substituted, or other substituted cyclic amines which further incorporate steric hindrance, generally derived from aliphatic substitution on the carbon atoms adjacent to the amine function. The polymeric compositions preferably incorporate from about 0.05 to about 10.0 wt %, or more preferably, from about 0.05 to about 5.0 wt %, or most preferably, from about 0.05 to about 1.0 wt %, of HALS, based on the total weight of the composition.

It is understood, however, that any suitable additives known within the art may be included in the polymeric films or sheets. Such suitable additives may include, without limitation, processing aides, flow enhancing additives, lubricants, pigments, dyes, flame retardants, impact modifiers, nucleating agents that can increase crystallinity, anti-blocking agents such as silica, thermal stabilizers, UV stabilizers, dispersants, surfactants, chelating agents, coupling agents, adhesives, primers, reinforcement additives, such as glass fiber, fillers and the like. For example, typical colorants can include a bluing agent that can reduce the appearance of yellowing. When the present polymeric sheet is used as a solar cell encapsulant layer, however, additives that can reduce the optical clarity of the sheet, such as reinforcement additives and fillers, are generally reserved for the back-sheet encapsulant layer.

It has now surprisingly been found that stiffer poly(vinyl butyral)s, which typically also exhibit lower adhesion to glass, yields glass laminates that perform better in P2A tests than laminates fabricated from softer poly(vinyl butyral)s, which typically exhibit higher adhesion to glass. More specifically, and without wishing to be held to theory, it is hypothesized that the mechanical properties of the plasticized poly(vinyl butyral), in particular the material's stress/strain curves, are correlated with the performance of glass laminates fabricated from the material in a P2A test.

Accordingly, the plasticized poly(vinyl butyral) sheet preferably has an E50 of about 300 psi or greater. The E50 is the force required to deform a test specimen to 50% elongation. The E50 is determined according to the ISO 527-3 standard method, with the exception that the force at 50% elongation is measured. Preferably, the plasticized poly(vinyl butyral) sheet has an E50 of about 400 psi or greater, or more preferably, about 450 psi or greater.

The E120 is the force required to deform a test specimen to 120% elongation. The E120 is also determined according to the ISO 527-3 standard method, with the exception that the force at 120% elongation is measured. More preferably, the plasticized poly(vinyl butyral) sheet has an E120 of about 8 to about 15 $N/mm^2$, about 9 to about 15 $N/mm^2$, about 10 to about 15 $N/mm^2$, about 11 to about 15 $N/mm^2$ or about 11.5 to about 13.5 $N/mm^2$.

As used herein, the values of E50 and E120 are normalized by conventional methods to remove the variations in the measured values that are caused by differing cross-sectional areas of the test specimens.

In addition, it is well known that poly(vinyl butyral) is a hygroscopic material. Moreover, poly(vinyl butyral) having higher moisture levels becomes softer. Consequently, it is also important to regulate the moisture level of the poly(vinyl butyral) before conducting any elongation measurements, for example by equilibrating the test specimens at a controlled temperature and relative humidity for a sufficiently long period of time. Preferably, the poly(vinyl butyral) samples are stored at room temperature (about 20 to 25° C.) and 30% relative humidity for one day, two days, or up to a week before the stress/strain curves are measured.

Methods of adjusting the stiffness of a polymer, and in particular that of a poly(vinyl butyral), are known to those of skill in the art. Notable methods include adjusting the level of cross-linking, adjusting the level of plasticizer, adjusting the level of moisture, and adjusting the level of filler.

In particular, poly(vinyl butyral) sheets such as those known as "translucent white" sheets may include a sufficient amount of titanium dioxide ($TiO_2$) filler to raise their elongation values into the ranges set forth above, although the same plasticized poly(vinyl butyral), unfilled, would have a lower value and may not consistently pass the P2A test. In this connection, thinner translucent white sheets typically include higher levels of filler. For example, of two sheets fabricated from the same plasticized poly(vinyl butyral), even if the elongation value of the poly(vinyl butyral) is too low to be within the ranges set forth above, a translucent white sheet having a thickness of 15 mil (0.38 mm) may include twice the amount of filler as a translucent white sheet having a thickness of 30 mils (0.76 mm). The thinner sheet is predicted to have a higher elongation value, and may consistently pass the P2A test, if its elongation value is within the ranges set forth above. In contrast, the thicker sheet is also predicted to have an elongation value that is higher than that of the unfilled poly(vinyl butyral); however, the amount of filler may be insufficient to raise the elongation into the ranges set forth above, and the thicker sheet may not consistently pass the P2A test.

Similar principles apply to the stiffness of other pigmented or filled poly(vinyl butyral) sheets, such as sheets comprising calcium carbonate for producing laminates that have a "frosted" appearance and "solid color" green sheets, for example, and to the P2A performance of glass laminates fabricated from these other sheets.

The polymeric sheets of the present invention may be produced through any known process. Generally, the sheets are produced through extrusion casting processes. Preferably, the poly(vinyl butyral) interlayer sheet has a thickness of about 20 to about 45 mils. In addition, the sheets may have smooth or roughened surfaces. Preferably, the sheets have roughened surfaces to facilitate the de-airing through the lamination process, as described below.

In a preferred process, plasticized poly(vinyl butyral) sheets may be formed by initially mixing the poly(vinyl butyral) resin composition with plasticizer and then extruding the formulation through a sheet-shaping die, i.e. forcing molten, plasticized poly(vinyl butyral) through a horizontally long, vertically narrow die opening substantially conforming in length and width to that of the sheet being formed. The poly(vinyl butyral) compositions can be extruded at a temperature of from about 190° C. to about 225° C. Rough surfaces on one or both sides of the extruding sheet are preferably provided by the design of the die opening and the temperature of the die exit surfaces through which the extrudate passes, as disclosed in, e.g., U.S. Pat. No. 4,281,980. Alternative techniques for producing a preferable rough surface on an extruding poly(vinyl butyral) sheet involve the specification and control of one or more of polymer molecular weight distribution, water content and melt temperature. The sheet formation of poly(vinyl butyral) is disclosed in U.S. Pat. Nos. 2,904,844; 2,909,810; 3,679,788; 3,994,654; 4,161,565; 4,230,771; 4,292,372; 4,297,262; 4,575,540; 5,151,234; 5,886,0675, and European Patent No. 0 185 863. Alternatively, the as-extruded film or sheet may be passed over a specially prepared surface of a die roll positioned in close proximity to the exit of the die which imparts the desired preferable surface characteristics to one side of the molten polymer. Thus, when the surface of such roll has minute peaks and valleys, sheets formed of polymer cast thereon will have a rough surface on the side which contacts the roll which generally conforms respectively to the valleys and peaks of the roll surface. Such die rolls are disclosed in, e.g., U.S. Pat. No. 4,035,549. A roughened sheet surface is preferable to simplify the lamination process and to provide superior solar cell laminates. As is known, this rough surface is only temporary and particularly functions to facilitate de-airing during lamination, after which it is melted smooth from the elevated temperature and pressure associated with autoclaving and other lamination processes.

Glass Laminates

Further provided herein are safety glass laminates comprising at least one layer of the polymeric sheet or film and one layer of glass. Preferably, the glass laminates comprise or consist of one layer of the polymeric sheet bonded between two layers of glass. The thickness of the polymeric sheet used herein may be greater than or equal to about 15 mils (0.38 mm), or preferably, greater than or equal to about 30 mils. More preferably, the glass laminates comprise or consist of one layer of the poly(vinyl butyral) sheet described above which is bonded between two layers of glass.

The glass laminates may further comprise one or more other optional interlayers, rigid sheet layers or film layers. The other optional interlayers may be prepared through any known art process and may have smooth or roughened (e.g., embossed) surfaces. The other optional interlayers used herein may comprise any known suitable materials. Preferably, the other optional interlayers comprise compositions selected from the group consisting of ethylene acid copolymers and ionomers, ethylene-co-vinyl acetate (EVA), acoustic poly(vinyl acetal), acoustic poly(vinyl butyral), poly(vinyl butyral) (PVB), polyurethane (PU), polyvinylchloride (PVC), metallocene-catalyzed linear low density polyethylenes, polyolefin block elastomers, ethylene acrylate ester copolymers, such as poly(ethylene-co-methyl acrylate) and poly(ethylene-co-butyl acrylate), silicone elastomers and epoxy resins. More preferably, the other optional interlayers comprise compositions selected from the group consisting of ethylene acid copolymers and ionomers, ethylene-co-vinyl acetate (EVA), poly(vinyl butyral) (PVB), metallocene-catalyzed linear low density polyethylenes, and ethylene acrylate ester copolymers. The thickness of the individual other optional interlayer film or sheet components which make up the total interlayer of the present invention may be independently varied depending on the desired properties or the particular application.

To ensure the desired intrusion resistance laminate attributes, the total thickness of the poly(vinyl butyral) sheet components incorporated into the glass laminate is preferably greater than or equal to about 30 mils (0.76 mm). In order to improve the intrusion resistance yet further, the total thickness of the poly(vinyl butyral) sheet components may be greater than or equal to about 50 mils (1.25 mm), about 60 mils (1.50 mm), about 90 mils (2.25 mm), about 120 mils (3.00 mm) or greater.

The glass laminates may additionally incorporate one or more rigid sheet layers. The rigid sheets may be glass or rigid plastic sheets, such as, e.g., polycarbonate, acrylics, polyacrylate, cyclic polyolefins, such as ethylene norbornene polymers, metallocene-catalyzed polystyrene, polyamides, polyesters, fluoropolymers and the like and combinations thereof. Metal sheets, such as aluminum, steel or galvanized steel, or ceramic plates may be substituted for the rigid polymeric sheets or glass, in applications for which optical transparency is not required.

The term "glass" as used herein includes not only window glass, plate glass, silicate glass, sheet glass, low iron glass, tempered glass, tempered CeO-free glass, and float glass, but also includes colored glass, specialty glass which includes ingredients to control, e.g., solar heating, glass coated with, e.g., sputtered metals, such as silver or indium tin oxide, for solar control purposes, E-glass, Toroglass, Solex™ glass and the like. Such specialty glasses are disclosed in, e.g., U.S. Pat. Nos. 4,615,989; 5,173,212; 5,264,286; 6,150,028; 6,340,646; 6,461,736; and 6,468,934. The type of glass to be selected for a particular laminate depends on the intended use.

The glass laminates may further include one or more additional film layers. The additional film layers may be metal, such as aluminum foil, or polymeric. Preferable polymeric compositions used in the additional film layers include, but are not limited to, polyesters, such as poly(ethylene terephthalate), polycarbonate, polypropylene, polyethylene, polypropylene, cyclic polyloefins, norbornene polymers, polystyrene, syndiotactic polystyrene, styrene-acrylate copolymers, acrylonitrile-styrene copolymers, poly(ethylene naphthalate), polyethersulfone, polysulfone, nylons, poly(urethanes), acrylics, cellulose acetates, cellulose triacetates, cellophane, vinyl chloride polymers, polyvinylidene chloride, vinylidene chloride copolymers, fluoropolymers, polyvinyl fluoride, polyvinylidene fluoride, polytetrafluoroethylene, ethylene-tetrafluoroethylene copolymers and the like. The additional film layer may be formed of a multilayer film, such as fluoropolymer/polyester bilayer film and fluoropolymer/polyester/fluoropolymer trilayer film. More preferably, the additional film layer is formed of a biaxially oriented poly(ethylene terephthalate) film, aluminum foil, a fluoropolymer film, such as TEDLAR™ polyvinyl fluoride (PVF) or TEFZEL™ ethylene-co-tetrafluoroethylene (ETFE) films, which are commercial products of E.I. du Pont de Nemours & Co. of Wilmington, Del., a fluoropolymer/polyester bilayer film or a fluoropolymer/polyester/fluoropolymer trilayer film.

The thickness of the additional film layers may be varied depending on the desired properties or the particular application. Generally, the thickness of the additional film layer will range from about 0.1 mils (0.003 mm) to about 10 mils (0.26 mm), or preferably, from about 1 mil (0.025 mm) to about 4 mils (0.1 mm).

The additional polymeric film layers are preferably sufficiently stress-relieved so as to be shrink-stable under the conditions of the coating and lamination processes. Preferably, the additional polymeric film layers are heat stabilized to provide low shrinkage characteristics when subjected to elevated temperatures (i.e. less than 2% shrinkage in both directions after 30 minutes at 150° C.).

The additional film layer may be coated with one or more coatings if desired. For example, the additional film layers may be coated with organic infrared absorbers and sputtered metal layers, such as silver, coatings and the like. Metal coated polymeric films are disclosed in, e.g., U.S. Pat. Nos. 3,718,535; 3,816,201; 4,465,736; 4,450,201; 4,799,745; 4,846,949; 4,954,383; 4,973,511; 5,071,206; 5,306,547; 6,049,419; 6,104,530; 6,204,480; 6,255,031; and 6,565,982. The coatings may function as oxygen and moisture barrier coatings, such as the metal oxide coating disclosed within, e.g., U.S. Pat. Nos. 6,521,825 and 6,818,819 and European Patent No. EP 1 182 710.

If desired, one or both surfaces of the laminate layers, such as the interlayer sheet, the other optional interlayer sheets, rigid sheet layers, or film layers, may be treated to enhance the adhesion to other laminate layers. This treatment may take any form known within the art, including adhesives, primers, such as silanes, flame treatments, such as disclosed within U.S. Pat. Nos. 2,632,921; 2,648,097; 2,683,894; and 2,704,382, plasma treatments, such as disclosed within U.S. Pat. No. 4,732,814, electron beam treatments, oxidation treatments, corona discharge treatments, chemical treatments, chromic acid treatments, hot air treatments, ozone treatments, ultraviolet light treatments, sand blast treatments, solvent treatments, and the like and combinations thereof. For example, a thin layer of carbon may be deposited on one or both surfaces of the laminate layers through vacuum sputtering as disclosed in U.S. Pat. No. 4,865,711. In another example, U.S. Pat. No. 5,415,942 discloses a hydroxy-acrylic hydrosol primer coating that may serve as an adhesion-promoting primer for poly(ethylene terephthalate) films.

The adhesive or primer used herein preferably takes the form of a coating layer. The adhesive/primer coating may be less than 1 mil thick. Preferably, the thickness of the adhesive/primer coating is less than 0.5 mils, or more preferably, less than 0.1 mils. The adhesive may be any adhesive or primer known within the art. Preferably, the adhesive or primer is a silane which incorporates an amine function. Specific examples of such materials include, e.g., gamma-aminopropyl triethoxysilane, N-beta-(aminoethyl)-gamma-aminopropyl-trimethoxysilane, and the like and mixtures thereof. Commercial examples of such materials include, e.g., A-1100™ silane, (from the Silquest Company, formerly from the Union Carbide Company, believed to be gamma-aminopropyltrimethoxysilane) and Z6020™ silane, (from the Dow Company).

Preferably, one or both surfaces of the additional film layer(s) is treated to enhance the adhesion to the other laminate layers. This treatment may take any form known within the art, as described above. More preferably, however, the additional film layers are coated with a primer coating on one or both surfaces, and the primer is preferably a polyallylamine-based primer. The polyallylamine-based primer and its application to a poly(ethylene terephthalate) polymeric film are disclosed within U.S. Pat. Nos. 5,411,845; 5,770,312; 5,690,994; and 5,698,329. Generally, the poly(ethylene terephthalate) film is extruded and cast as a film by conventional methods, as described above, and the polyallylamine coating is applied to the poly(ethylene terephthalate) film either before stretching or between the machine direction stretching and transverse direction stretching operations, and/or after the two stretching operations and heat setting in the tenter oven. It is preferable that the coating be applied before the transverse stretching operation so that the coated poly(ethylene terephthalate) web is heated under restraint to a temperature of about 220° C. in the tenter oven in order to cure the polyallylamine to the poly(ethylene terephthalate) surface(s). Such materials are disclosed within, for example, U.S. Patent Application Publication No. 2005/0129954. In addition to this cured coating, an additional polyallylamine coating can be applied to the film after the stretching and tenter oven heat setting in order to obtain a thicker overall coating.

If desired, the edges of the safety glass laminates may be sealed to reduce moisture and air intrusion and their potentially degradation effect on the efficiency and lifetime of the laminate. This sealing may be accomplished by any means disclosed within the art. Suitable edge sealing materials include, but are not limited to, butyl rubber, polysulfide, silicone, polyurethane, polypropylene elastomers, polystyrene elastomers, block elastomers, styrene-ethylene-butylene-styrene (SEBS), and the like.

The glass laminate may take any form known within the art. Preferably, the glass laminate comprising the PVB interlayer sheet has a pummel value of about 2 to about 7 and a compressive shear strength of about 1000 to about 2500 psi.

Also preferred is a glass laminate comprising at least one layer of glass and at least one layer of the PVB interlayer sheet disclosed herein. Preferably, the at least one glass layer is in direct contact with the at least one polymeric interlayer sheet layer. Also preferably, the glass laminate comprises at least two layers of glass and at least one layer of the polymeric interlayer sheet laminated in between the glass layers.

Other specific examples of preferred glass laminate constructions include, e.g.,
glass/polymeric sheet;
glass/polymeric sheet/film;
glass/polymeric sheet/glass;
glass/polymeric sheet/film/polymeric sheet/glass;

glass/polymeric sheet/film/polymeric sheet/film/polymeric sheet/glass.

In each of the above laminates, "/" indicates adjacent layers. Moreover, the second layer of any film or sheet may be the same as or different from the first layer of that film or sheet. Likewise, the third layer may be the same as or different from the first and second layers of that film or sheet, and so on. Furthermore, in some preferred laminates, the adjacent layers are directly laminated to each other so that they are adjoining or, more preferably, contiguous.

Solar Cell Laminates

Still further provided herein is a solar cell laminate comprising at least one encapsulant layer that is formed of a polymeric sheet or film. Suitable polymeric sheets and films are described above.

Solar cells are commonly available in an ever increasing variety as the technology evolves and is optimized. As the term is used herein, a solar cell includes any article that can convert light into electrical energy. Typical examples of the various forms of solar cells include, without limitation, single crystal silicon solar cells, polycrystal silicon solar cells, microcrystal silicon solar cells, amorphous silicon based solar cells, copper indium selenide solar cells, compound semiconductor solar cells, dye sensitized solar cells, and the like. The most common types of solar cells include multi-crystalline solar cells, thin film solar cells, compound semiconductor solar cells and amorphous silicon solar cells, due to their relatively low cost and the ease of manufacturing large scale solar cells from these materials.

Thin film solar cells are typically produced by depositing several thin film layers onto a substrate, such as glass or a flexible film, with the layers being patterned so as to form a plurality of individual cells which are electrically interconnected to produce a suitable voltage output. Depending on the sequence in which the multi-layer deposition is carried out, the substrate may serve as the rear surface or as a front window for the solar cell module. By way of example, thin film solar cells are disclosed in U.S. Pat. Nos. 5,512,107; 5,948,176; 5,994,163; 6,040,521; 6,137,048; and 6,258,620. Examples of thin film solar cell modules are those that comprise cadmium telluride or (Cu(In—Ga)(SeS$_2$) ("CIGS").

A solar cell laminate typically consists of (i) a solar cell layer that is formed of one solar cell or a plurality of solar cells that may be electronically interconnected, (ii) one or more encapsulant layers laminated to either side of the solar cell layer, such as the front-sheet encapsulant layer that is laminated to the light-receiving side of the solar cell layer and the back-sheet encapsulant layer that is laminated to the rear side of the solar cell layer, (iii) a first outer layer on the light-receiving side of the laminate, i.e., the incident layer; (iv) a second outer layer on the rear side of the laminate, i.e., the backing layer; and (v) optionally other functional film or sheet layers embedded with the laminate, such as dielectric layers or barrier layers (e.g., moisture or oxygen barrier layers). It is preferred that all the film or sheet layers on the light-receiving side of the laminate be made of transparent materials to allow the transmission of sunlight into the solar cell(s). In some instances, a special film or sheet layer may be included to serve both the function of an encapsulant layer and an outer layer, e.g., an incident layer and a front-sheet. It is also conceivable that any of the functional film or sheet layers used herein may be formed of single- or multi-layer films or sheets.

The solar cell module disclosed herein comprises a solar cell layer and at least one encapsulant layer formed of the polymeric sheet disclosed herein. The polymeric sheet is laminated to one side of the solar cell layer. The solar cell layer and the polymeric sheet may be adjacent, or the polymeric sheet may be laminated directly to the solar cell layer, so that the polymeric sheet and the solar cell layer are at least partially adjacent or at least partially contiguous.

The solar cell laminate may further comprise other encapsulant layer(s) derived from any type of suitable films or sheets. Such suitable films or sheets include, but are not limited to, films or sheets comprising poly(vinyl butyral), ionomers, EVA, acoustic poly(vinyl acetal), acoustic poly (vinyl butyral), PU, PVC, metallocene-catalyzed linear low density polyethylenes, polyolefin block elastomers, ethylene acrylate ester copolymers, such as poly(ethylene-co-methyl acrylate) and poly(ethylene-co-butyl acrylate), acid copolymers, silicone elastomers and epoxy resins. In one particular embodiment, the solar cell laminate of the present invention comprises at least one front-sheet encapsulant layer and at least one back-sheet encapsulant layer, wherein one of the two encapsulant layers is formed of the polymeric sheet disclosed herein. More particularly, the two encapsulant layers may be both formed of the polymeric sheet disclosed herein.

It is preferred that the solar cell laminate further comprise an incident layer formed of a transparent material, such as glass. Transparent polymeric films, such as the fluoropolymer or poly(ethylene terephthalate) films described above, may also be used as the incident layer.

It is more preferred that the solar cell laminate also comprise a backing layer. The backing layers used herein are typically formed of glass, metal films or sheets (e.g., aluminum, steel, or galvanized steel films or sheets), ceramic plates, or plastic films or sheets (e.g., fluoropolymer or poly (ethylene terephthalate) films).

The solar cell laminates may further comprise one or more other additional layers of films or sheets, such as dielectric layers and barrier layers, e.g., oxygen or moisture barrier layers.

If desired, a layer of non-woven glass fiber (scrim) may be included in the solar cell laminate to facilitate de-airing during the lamination process or to serve as reinforcement for the encapsulant layer(s). The use of such scrim layers within solar cell laminates is disclosed in U.S. Pat. Nos. 5,583,057; 6,075,202; 6,204,443; 6,320,115; 6,323,416, and European Patent No. EP 0 769 818.

Any of the layers of the solar cell laminate may have a layer of adhesive or primers to enhance the bond strength between the laminate layers, if desired. Suitable adhesives and primers include those described above with respect to the glass laminates.

The edges of the solar cell laminates may also be sealed to reduce moisture and air intrusion. Suitable sealants include those described above with respect to safety glass laminates.

The polymeric sheet used as an encapsulant in the solar cell laminate of the present invention preferably has a thickness less than or equal to about 30 mils (0.76 mm), or more preferably, less than or equal to about 20 mils (0.51 mm), or still more preferably, from about 10 mils (0.25 mm) to about 20 mils (0.51 mm). However, to maintain the desirable solar cell laminate intrusion resistance, the total thickness of the encapsulant sheets incorporated in the solar cell laminate is preferably greater than or equal to about 30 mils (0.76 mm).

One specifically preferred solar cell laminate comprises at least one layer of glass, at least one layer of the poly(vinyl butyral) sheet disclosed herein, and a solar cell layer formed of one solar cell or a plurality of solar cells that may be electronically interconnected. In this solar cell laminate, the glass layer serves as an incident or backing layer and the poly(vinyl butyral) sheet serves as an encapsulant layer which has one surface in direct contact with the glass layer and an opposite surface in direct contact with the solar cell layer.

A more preferred solar cell laminate comprises an incident layer formed of glass, a front-sheet encapsulant layer formed of the poly(vinyl butyral) sheet disclosed herein, a solar cell layer formed of one solar cell or a plurality of solar cells that may be electronically interconnected, a back-sheet encapsulant layer formed of the poly(vinyl butyral) sheet disclosed herein, and a backing layer formed of glass.

In one example, a preferred solar cell laminate comprises a first encapsulant layer formed of the PVB interlayer sheet disclosed above and a solar cell layer comprising one solar cell or a plurality of solar cells that may be electronically interconnected. Preferably, the solar cell laminate further comprises a second encapsulant layer laminated to an opposite side of the solar cell layer from the first encapsulant layer and comprising a composition selected from the group consisting of poly(vinyl butyral), ethylene acid copolymers and ionomers, ethylene vinyl acetate (EVA), acoustic poly(vinyl acetal), acoustic poly(vinyl butyral), poly(vinyl butyral) (PVB), thermoplastic polyurethane (TPU), polyvinylchloride (PVC), metallocene-catalyzed linear low density polyethylenes, polyolefin block elastomers, ethylene acrylate ester copolymers, acid copolymers, silicone elastomers and epoxy resins. Also preferably, the solar cell laminate comprises a front-sheet encapsulant layer and a back-sheet encapsulant layer, both being formed of the PVB interlayer sheet disclosed above. In yet another preferred embodiment, the solar cell laminate further comprises an incident layer and/or a backing layer.

Also preferred is a solar cell laminate consisting of, from top to bottom: (i) an incident layer formed of transparent material, which is laminated to, (ii) a front-sheet encapsulant layer comprising the PVB interlayer sheet disclosed herein, which is laminated to, (iii) a solar cell layer comprising one or a plurality of electronically interconnected solar cells, which is laminated to, (iv) an optional back-sheet encapsulant layer that is laminated to, (v) a backing layer.

The solar cell laminate may take any form known within the art. Preferable specific solar cell laminate constructions (top (light incident) side to back side) include, e.g., glass/polymeric sheet/solar cell/polymeric sheet/glass;
glass/polymeric sheet/solar cell/polymeric sheet/Tedlar™ PVF film;
Tedlar™ PVF film/polymeric sheet/solar cell/polymeric sheet/glass;
Tedlar™ PVF film/polymeric sheet/solar cell/polymeric sheet/Tedlar™ PVF film;
glass/polymeric sheet/solar cell/polymeric sheet/PET film;
Tedlar™ PVF film/polymeric sheet/solar cell/polymeric sheet/PET film;
glass/polymeric sheet/solar cell/polymeric sheet/barrier coated film/polymeric sheet/glass;
glass/ionomer encapsulant layer/solar cell/optional encapsulant layer/barrier coated film/polymeric sheet/Tedlar™ PVF film;
Tedlar™ PVF film/polymeric sheet/barrier coated film/polymeric sheet/solar cell/polymeric sheet/barrier coated film/polymeric sheet/Tedlar™ PVF film;
glass/polymeric sheet/solar cell/polymeric sheet/aluminum stock;
Tedlar™ PVF film/polymeric sheet/solar cell/polymeric sheet/aluminum stock;
glass/polymeric sheet/solar cell/polymeric sheet/galvanized steel sheet;
glass/polymeric sheet/solar cell/polymeric sheet/PET film/polymeric sheet/aluminum stock;
Tedlar™ PVF film/polymeric sheet/solar cell/polymeric sheet/PET film/polymeric sheet/aluminum stock;
glass/polymeric sheet/solar cell/polymeric sheet/PET film/polymeric sheet/galvanized steel sheet;
Tedlar™ PVF film/polymeric sheet/solar cell/polymeric sheet/PET film/polymeric sheet/galvanized steel sheet;
glass/polymeric sheet/solar cell/acoustic poly(vinyl butyral) encapsulant layer/glass;
glass/polymeric sheet/solar cell/poly(vinyl butyral) encapsulant layer/Tedlar™ PVF film;
Tedlar™ PVF film/ionomer encapsulant layer/solar cell/polymeric sheet/glass;
Tedlar™ PVF film/polymeric sheet/solar cell/acid copolymer encapsulant layer/Tedlar™ PVF film;
glass/polymeric sheet/solar cell/ethylene vinyl acetate encapsulant layer/PET film;
Tedlar™ PVF film/polymeric sheet/solar cell/poly(ethylene-co-methyl acrylate) encapsulant layer/PET film; and
glass/poly(ethylene-co-butyl acrylate) encapsulant layer/solar cell/polymeric sheet/barrier coated film/poly(ethylene-co-butyl acrylate) encapsulant layer/glass.

The same notes and explanations of this notation set forth above with respect to the preferred glass laminates are equally applicable to these preferred solar cell laminates.

Lamination Processes

The lamination processes by which the safety glass laminates and the solar cell laminates described herein are produced may be autoclave or non-autoclave processes. Both types of process are well known in the art. For convenience, the processes are described below with respect to solar cell laminates; apparently, similar principles and conditions apply to processes for producing safety glass laminates.

For example, in a conventional process, an incident layer (e.g., a glass sheet), a front-sheet encapsulant layer (e.g., a polymeric sheet disclosed herein), a solar cell layer, a back-sheet encapsulant layer, a backing layer (e.g., another glass sheet), and any other films or sheets in between (e.g., a Tedlar® PVF film between the back-sheet encapsulant layer and the glass backing layer) are cut to size and stacked in order. This stack, in which the layers are not yet adhered by lamination, is referred to as a "pre-press assembly." The layers of the pre-press assembly are laminated together under heat and elevated pressure or a vacuum (for example, in the range of about 27-28 inches (689-711 mm) Hg) to remove air. Preferably, when glass sheets are used as the incident layer and/or backing layer, they are washed and dried prior to assembly. A typical glass type that may be used herein is 90 mil thick annealed low iron glass.

In a representative non-autoclave procedure, a pre-press assembly of the laminate is placed into a bag capable of sustaining a vacuum ("a vacuum bag"), drawing the air out of the bag using a vacuum line or other means of creating a vacuum in the bag, sealing the bag while maintaining the vacuum, and placing the sealed bag in an autoclave at a temperature of about 120° C. to about 180° C., at a pressure of about 200 psi (15 bars) for from about 10 to about 50 minutes. Preferably the bag is autoclaved at a temperature of about 120° C. to about 160° C. for 20 to about 45 minutes, or more preferably, at a temperature of about 135° C. to about 160° C. for 20 to about 40 minutes, or still more preferably, at a temperature of about 145° C. to about 155° C. for 25 to about 35 minutes. A vacuum ring may be substituted for the vacuum bag. One type of vacuum bag is described in U.S. Pat. No. 3,311,517.

Alternatively, any air trapped within the laminate assembly may be removed through a nip roll process. For example, the laminate assembly may be heated in an oven at a temperature of about 80° C. to about 120° C., or preferably, at a temperature of between about 90° C. and about 100° C., for about 30 minutes. Thereafter, the heated laminate assembly is passed through a set of nip rolls so that the air in the void spaces between the solar cell outside layers, the solar cell and the encapsulant layers may be expelled, and so that the edge of the assembly may be sealed. This process may provide the final solar cell laminate or may provide what is referred to as a pre-press assembly, depending on the materials of construction and the exact conditions utilized.

Further information about non-autoclave lamination processes is available, for example, in U.S. Pat. Nos. 3,234,062; 3,852,136; 4,341,576; 4,385,951; 4,398,979; 5,536,347; 5,853,516; 6,342,116; and 5,415,909, US Patent Application No. 2004/0182493, European Patent No. EP 1 235 683 B1, and PCT Patent Application Publication Nos. WO 91/01880 and WO 03/057478 A1.

In a typical autoclave procedure, the pre-press assembly is placed in an air autoclave. The temperature is raised to about 120° C. to about 160° C., or preferably, between about 135° C. and about 160° C., and the pressure is raised to between about 100 and about 300 psig, or preferably, about 200 psig (14.3 bar). These conditions are maintained for about 15 minutes to about 1 hour, or preferably, about 20 to about 50 minutes, after which, the air is cooled while no more air is added to the autoclave. After about 20 minutes of cooling, the excess air pressure is vented and the solar cell laminates are removed from the autoclave.

A preferred process of manufacturing a solar cell laminate comprises: (i) providing an assembly comprising from top to bottom an incident layer, a front-sheet encapsulant layer comprising the PVB interlayer sheet disclosed herein, a solar cell layer comprising one solar cell or a plurality of solar cells that may be electronically interconnected, an optional back-sheet encapsulant layer, and a backing layer and (ii) laminating the assembly to form the solar cell laminate. Preferably, the lamination is conducted by subjecting the assembly to heat. Also preferably, the lamination is conducted by subjecting the assembly to heat and pressure or vacuum.

Physical Properties of the Laminates

Polymeric interlayer sheets according to the invention provide safety glass and solar cell laminates that have penetration resistance, as determined by one or more of (a) passing the modified EN365 P2A test; (b) adequate glass adhesion, as demonstrated by a pummel value greater than or equal to about 1; or (c) a compressive shear strength greater than or equal to about 1000 psi. Preferably, the pummel value is greater than or equal to about 3.5 and the compressive shear strength is greater than ort equal to about 2250 psi.

I. Modified EN 356 P2A Test:

The polymeric interlayer sheets of the invention yield laminates having penetration resistance. As used herein, the term "penetration resistance" refers to the property of having passed the EN356 P2A test protocol as modified herein. As discussed above, EN 356 P2A is a standard protocol of testing glass laminates for resistance against manual attack. It is commonly used in Europe.

Float glass is generally used in the construction of the test laminates used for the EN 356 P2A testing. Float glass is produced by casting molten glass on a bed of tin resulting in the float glass having a tin side (T) (i.e., the glass surface in contact with the tin during casting) and an air side (A) (i.e., the glass surface in contact with air and opposite the tin during casting). It is common within the art to express the orientation of the float glass as TA (i.e., tin side up) or AT (i.e., air side up). Now referring to FIG. 1, for glass laminates which incorporate two layers of float glass 12 with one polymeric interlayer 14 in between, such as those used for the EN 356 P2A testing, it is common to express the orientation of both layers of the float glass as, for example, ATAT (FIG. 1A), whereby both layers of glass have their tin sides 12$b$ down, or TATA (FIG. 1B), whereby both layers of glass have their air sides 12$a$ down. Glass laminators, especially architectural glass laminators, generally cannot or do not turn glass plates in the lamination process. This results in the produced glass laminate having a ATAT float glass orientation (tin sides down) or a TATA float glass orientation (tin sides up), rather than another orientation, such as TAAT or ATTA. Consequently, two distinct glass laminate types may be used in the EN 356 P2A test protocol, as shown in FIGS. 1A and 1B.

Figure 1B:
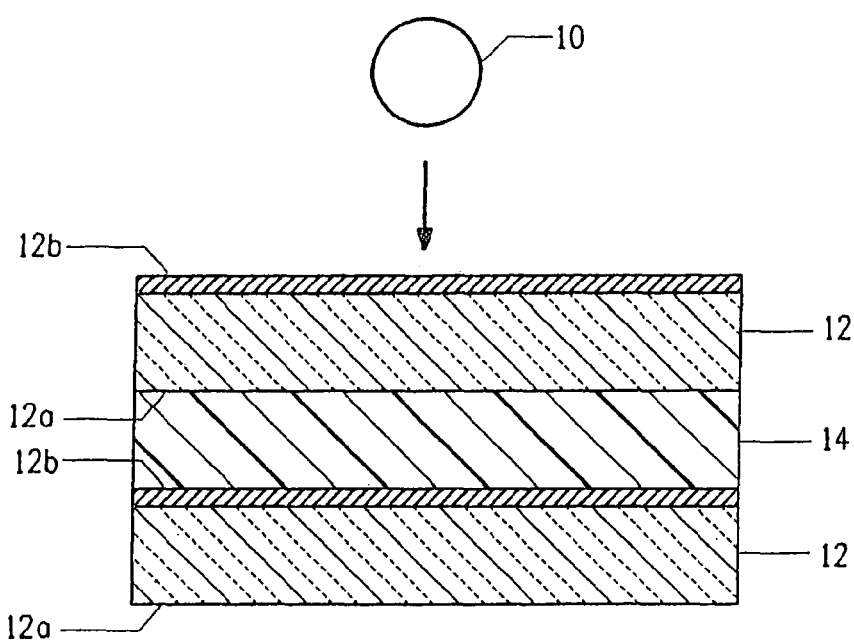
FIG. 1B is a cross-sectional view of the construction of a "TATA" laminate in the course of a EN 365 P2A impact test.

As it is shown in FIG. 1, as the ball 10 impacts the laminate during the EN 356 P2A testing, the laminate bends and generally the surface of the bottommost glass sheet (opposite from the ball) breaks first. Therefore, in the ATAT orientation (FIG. 1A), it is the tin side 12$b$ of the bottom glass which breaks first, while in the TATA orientation (FIG. 1B), it is the air side 12$a$ of the bottom glass which breaks first. It is known within the art that the air side 12$a$ of float glass is much tougher than the tin side of float glass. Therefore, typically, the glass laminate with the ATAT glass orientation (FIG. 1A) breaks more easily than the glass laminate with the TATA glass orientation (FIG. 1B) when it is subject to the EN 356 P2A test. Consequently, the probability of passing the EN 356 P2A test, independent of the identity of polymeric interlayer, may be somewhat dependent on the orientation of the two float glass sheets incorporated within the laminate.

The standard EN 356 P2A test protocol allows for the random orientation of the glass sheets, that is, the laminates may be tested in either or both of the TATA and ATAT orientations. In the present disclosure, however, when the EN 356 P2A test is conducted, the glass sheets are oriented with their tin sides down, "ATAT", to provide the weakest laminate with the greatest potential for failure. Increasing the rigorousness of the standard in this way is meant to ensure that the protocol identifies and distinguishes the most robust glazing.

Another modification to the standard EN 356 P2A test protocol, as practiced herein, is that ten (10) laminate replicates are tested using the EN 356 P2A testing instead of the three (3) laminate replicates required by the standard. This provides a statistically upgraded test protocol and improves the assurance that the polymeric interlayer will provide the desirable intrusion resistance.

II. Adhesion Tests

In the glazing art, it has been found that those polymeric interlayers that have low glass adhesion pass the EN 356 P2A test more easily. However, low glass adhesion generally allows for shards of glass to rain down and impact the very people the safety glass was designed to protect.

Pummel adhesion (PA) tests are well known and commonly used within the glazing art. See, e.g., U.S. Pat. No. 5,618,863. Generally, the pummel adhesion value is determined by the amount of glass lost from the glass laminate after a standard impact. The polymeric sheets disclosed herein preferably yield laminates having a pummel value of about 1 or greater, more preferably, about 2 to about 7, or also preferably greater than or equal to 3.5.

The compression shear strength (CSS) test has been described in U.S. Pat. No. 6,599,630. The polymeric sheets disclosed herein preferably yield laminates having a compression shear strength of about 1000 psi or greater, more preferably, about 1000 to about 2500 psi, or also preferably greater than or equal to about 2250 psi.

The following examples are provided to describe the invention in further detail. These examples, which set forth a preferred mode presently contemplated for carrying out the invention, are intended to illustrate and not to limit the invention.

EXAMPLES

The solar cell interconnections are omitted from the examples below to clarify the structures; however, any solar cell interconnections that are known in the art may be utilized within the present invention.

Methods

The following methods are used in the Examples and Comparative Examples presented hereafter.

I. EN 356 P2A Test:

The polymeric sheets of the present invention were subjected to the modified EN 356 P2A test as described above. The number of laminate passing the test (a) out of the total number of laminate replicates tested (b) was reported as "a of b".

II. Pummel Adhesion Test:

The pummel adhesion of the polymeric sheets was measured by the procedure disclosed in U.S. Pat. No. 5,618,863. Briefly, a portion of a laminate consisting of two outer glass layers bonded by a testing interlayer sheet, typically having dimensions of 15 by 30 cm, was subjected to the pummel test. First, this portion of the laminate was cooled for 8 hours at a temperature of −18° C. It was then held in a pummel testing machine at a 45° angle to a supporting table. A force was evenly applied over a 10 by 15 cm area of the sample with a 450 g flathead hammer at a predetermined rate until the glass became pulverized. Once the glass pulverized, the glass remaining glued to the polymeric interlayer was compared with a list of formal standards. These standards comprise a scale ranging from 0 to 10 and are given as:

Percent of the Surface of the Polymeric Interlayer that Came Unglued During Breaking Pummel Value

| | |
|---|---|
| 100 | 0 |
| 95 | 1 |
| 90 | 2 |
| 85 | 3 |
| 60 | 4 |
| 40 | 5 |
| 20 | 6 |
| 10 | 7 |
| 5 | 8 |
| 2 | 9 |
| 0 | 10 |

The pummel test was performed on both surfaces of the laminated glass and a pummel value recorded for each surface tested. In general, good impact performance is attained at a pummel adhesion of greater than 5 for each surface, e.g., 5/5.

III. Compressive Shear Strength:

Compressive Shear Strength was determined through the method described in U.S. Pat. No. 6,599,630. Specifically, six (6) 1" by 1" (25 mm by 25 mm) chips are sawed from a laminate consisting two outer layers of 2.3 mm thick annealed float glass bonded by a testing interlayer sheet. The chips are conditioned in a room controlled at 23° C.±2° C. and 50±1% relative humidity for one hour prior to testing. The compressive shear strength of the chip was determined using a jig such as that shown in FIG. 1 of U.S. Pat. No. 6,599,630. The chip was placed on the cut-out on the lower half of the jig, and the upper half was then placed on top of the chip. A cross-head was lowered at the rate of 0.1 inch per minute (2.5 mm per minute) until it contacted the upper piece of the device. As the cross-head continued to travel downward, one piece of glass of the chip began to slide relative to the other. The compressive shear strength of the chip was the shear stress required to cause adhesive failure. The precision of this test is such that one standard deviation is typically 6% of the average result of six (6) chips.

IV. Stress Vs. Elongation

As described above, the E50 value is the force required to deform a sheet to 50% elongation. E50 is determined by the ISO EN 527 standard, part 1-3, with the exception that the force at 50% elongation is measured. Likewise, the E120 value is determined according to the ISO 527 standard method, with the exception that the force at 120% elongation is measured. Again, when necessary the measured values are normalized to remove the variations in the measured values that are caused by differing cross-sectional areas of the test specimens. Furthermore, although not required by the standard method, levels of moisture in the test specimens were controlled by equilibrating the specimens at 30% relative humidity for 24 h to 48 h, or up to a week, at room temperature (about 20 to about 25° C.).

V. Lamination Process 1:

The laminate layers described below are stacked (laid up) to form the pre-laminate structures described within the examples. For the laminate containing a film layer as the incident or back-sheet layer, a cover glass sheet is placed over the film layer. The pre-laminate structure is then placed within a vacuum bag, the vacuum bag is sealed and a vacuum is applied to remove the air from the vacuum bag. The bag is placed into an oven and while maintaining the application of the vacuum to the vacuum bag, the vacuum bag is heated at 135° C. for 30 minutes. The vacuum bag is then removed from the oven and allowed to cool to room temperature (25±5° C.). The laminate is then removed from the vacuum bag after the vacuum is discontinued.

VI. Lamination Process 2:

The laminate layers described below are stacked (laid up) to form the pre-laminate structures described within the examples. For the laminate containing a film layer as the incident or back-sheet layer, a cover glass sheet is placed over the film layer. The pre-laminate structure is then placed within a vacuum bag, the vacuum bag is sealed and a vacuum is applied to remove the air from the vacuum bag. The bag is placed into an oven and heated to 90-100° C. for 30 minutes to remove any air contained between the assembly. The pre-press assembly is then subjected to autoclaving at 135° C. for 30 minutes in an air autoclave to a pressure of 200 psig (14.3 bar), as described above. The air is then cooled while no more air is added to the autoclave. After 20 minutes of cooling when the air temperature reaches less than about 50° C., the excess pressure is vented, and the laminate is removed from the autoclave.

Examples 1 and 2 and Comparative Examples CE1-7

The E50 values of the PVB sheets described below in Table 1 were measured. Float glass/PVB sheet/float glass laminates using these PVB sheets were prepared through a standard autoclave process similar to Lamination Process 2, above. The CSS values of the laminates were measured, and the laminates were also subjected to the modified P2A test described above. The results of these three measurements are reported below in Table 1.

TABLE 1

| Example | PVB Sheet | Pummel | CSS (psi) | P2A Testing | E50 (psi) | E120 (N/mm²) |
|---|---|---|---|---|---|---|
| CE 1 | PVB(a) | 5.1/5.3 | 1989 | No, 0 of 5 | | |
| CE 2 | PVB(b) | 1.0/1.5 | 1475 | No, 9 of 10 | | |
| CE 3 | PVB(c) | 3.3/3.0 | 1704 | Yes, 9 of 9 | 210 | |
| CE 4 | PVB(d) | 5.5/5.8 | 2243 | No, 8 of 9 | 253 | |
| CE 5 | PVB(e) | 2.5/3.0 | 2186 | Yes, 10 of 10 | | |
| CE 6 | PVB(f) | 5.0/5.0 | 1517 | No, 0 of 5 | 67 | |
| CE 7 | PVB(g) | 3.5 | 2195 | Yes, 10 of 10 | | |
| CE 8 | PVB(g1) | | | Not good | | 4.9 |
| CE 9 | PVB(g2) | | | Not good | | 6.0 |
| 1 | PVB(h) | 3.8/4.1 | 2408 | Yes, 10 of 10 | 490 | |
| 2 | PVB(i) | 3.8/3.8 | 2698 | Yes, 10 of 10 | 315 | |
| 3 | PVB(j) | 4.0 | 2408 | Yes, 10/10 | | 13.19 |
| 4 | PVB(k) | | | Good | | 11.5 |
| 5 | PVB(l) | | | Good | | 10.5 |
| 6 | PVB(m) | | | Good | | 8.7 |

Notes for Table 1:
PVB(a) was a plasticized poly(vinyl butyral) sheet comprising 26.5 wt % of triethylene glycol di-2-ethylhexanoate plasticizer. The PVB sheet had an average thickness of 30 mils (0.76 mm).
PVB(b) was a plasticized poly(vinyl butyral) sheet comprising 26.4 wt % of triethylene glycol di-2-ethylhexanoate plasticizer. The PVB sheet had an average thickness of 29.9 mils (0.76 mm) and a moisture level of 0.425 wt %.
PVB(c) was a SAFLEX RC41 poly(vinyl butyral) sheet (a product of the Solutia Company). The PVB sheet had an average thickness of 29.2 mils (0.742 mm) and a moisture level of 0.35 wt %.
PVB(d) was a plasticized poly(vinyl butyral) sheet comprising 26.7 wt % of triethylene glycol di-2-ethylhexanoate plasticizer. The PVB sheet had an average thickness of 28.2 mils (0.715 mm) and a moisture level of 0.43 wt %.
PVB(e) was a plasticized poly(vinyl butyral) sheet comprising 24.5 wt % of triethylene glycol di-2-ethylhexanoate plasticizer. The PVB sheet had an average thickness of 28.7 mils (0.728 mm) a magnesium level of 38 ppm and a moisture level of 0.43 wt %.
PVB(f) was a plasticized poly(vinyl butyral) sheet comprising 31.7 wt % of tetraethylene glycol di-n-heptanoate plasticizer. The PVB sheet had an average thickness of 30 mils (0.76 mm).
PVB(g) was a TROPLAS HT MV-FR sheet (a product of the Troplast-Sekisui Corporation). The PVB sheet had an average thickness of 29.7 mils (0.75 mm). This sheet was visually less stiff than the sheet for Examples 1 and 2.
PVB(g1) was a sheet of S-LEC RZ10 available from the Sekisui Chemical Company, Ltd, of Osaka, Japan.
PVB(g2) was a sheet of SAFLEX WC.
PVB(h) was a plasticized poly(vinyl butyral) sheet comprising 24.6 wt % of triethylene glycol di-2-ethylhexanoate plasticizer. The PVB sheet had an average thickness of 28.7 mils (0.728 mm) and a magnesium level of 38 ppm.
PVB(i) was a plasticized poly(vinyl butyral) sheet comprising 24.5 wt % of triethylene glycol di-2-ethylhexanoate plasticizer. The PVB sheet had an average thickness of 28.8 mils (0.731 mm), a magnesium level of 28 ppm and a moisture level of 0.46 wt %.
PVB(j) was a plasticized poly(vinyl butyral) sheet comprising 32.7% of PLA and having a moisture level of 0.44%.
PVB(k) was a second plasticized poly(vinyl butyral) sheet comprising 32.7% of PLA.
PVB(l) was a plasticized sheet of "translucent white" poly(vinyl butyral) having a thickness of 15 mils (0.38 mm).
PVB(m) was a plasticized sheet of "translucent white" poly(vinyl butyral) having a thickness of 30 mils (0.76 mm).

Examples 3-16

The 12-inch by 12-inch solar cell laminate structures described in Table 2, below, are assembled and laminated by Lamination Process 1, described above. Layers 1 and 2 constitute the incident layer of the solar cell laminate and Layers 4 and 5 constitute the back layer of the solar cell laminate. The structures of the solar cells of Examples 3 to 16 are also set forth in Table 2, below.

Examples 17-30

Examples 17 to 30 have structures that are identical to those of Examples 3 to 16, respectively, as set forth in Table 2, below. They are assembled and laminated according to Lamination Process 2, above.

TABLE 2

Solar Cell Laminate Structures

| Example | Layer 1 | Layer 2 | Layer 3 | Layer 4 | Layer 5 |
|---|---|---|---|---|---|
| 3, 17 | Glass 1 | PVB(h) | Solar Cell 1 | PVB(h) | Glass1 |
| 4, 18 | Glass 2 | PVB(i) | Solar Cell 2 | PVB(i) | Glass2 |
| 5, 19 | Glass 1 | PVB(m) | Solar Cell 3 | PVB(m) | Glass2 |
| 6, 20 | Glass 1 | PVB(n) | Solar Cell 4 | PVB(n) | Glass2 |
| 7, 21 | FPF | PVB(n) | Solar Cell 1 | PVB n | FPF |
| 8, 22 | Glass 1 | PVB(h) | Solar Cell 1 | Ionomer 1 | Glass3 |
| 9, 23 | FPF | PVB(i) | Solar Cell 4 | EBA | AL |
| 10, 24 | Glass 1 | PVB(h) | Solar Cell 1 | ACR | AL |
| 11, 25 | Glass 2 | Ionomer 2 | Solar Cell 4 | PVB(i) | AL |
| 12, 26 | FPF | PVB(h) | Solar Cell 1 | PVB(A) | Glass2 |
| 13, 27 | FPF | PVB(i) | Solar Cell 4 | EMA | FPF |
| 14, 28 | Glass 1 | PVB(m) | Solar Cell 1 | PVB(m) | AL |
| 15, 29 | Glass 1 | PVB(h) | Solar Cell 2 | EVA | Glass1 |
| 16, 30 | Glass 2 | PVB(i) | Solar Cell 1 | PVB | Glass2 |

Notes for Table 2:
ACR is a 20 mil (0.51 mm) thick embossed sheet of a poly(ethylene-co-methacrylic acid) comprising 15 wt % of polymerized residues of methacrylic acid and having a MI of 5.0 g/10 minutes (190° C., ISO 1133, ASTM D1238).
AL is an aluminum sheet (3.2 mm thick) and is 5052 alloyed with 2.5 wt % of magnesium and conforms to Federal specification QQ-A-250/8 and ASTM B209.
EBA is a formulated composition based on poly(ethylene-co-butyl acrylate) comprising 20 wt % of polymerized residues of butyl acrylate based on the weight of the total copolymer in the form of 20 mil thick (0.51 mm) sheet.
EMA is a formulated composition based on poly(ethylene-co-methyl acrylate) comprising 20 wt % of polymerized residues of methyl acrylate based on the weight of the total copolymer in the form of 20 mil thick (0.51 mm) sheet.
EVA is SC50B, believed to be a formulated composition based on poly(ethylene-co-vinyl acetate) in the form of 20 mil thick (0.51 mm) sheet (a product of the Hi-Sheet Corporation, formerly Mitsui Chemicals Fabro, Inc.).
FPF is a corona surface treated Tedlar ® PVF film (1.5 mil (0.038 mm) thick), a product of the DuPont Corporation.
Glass1 is Starphire ® glass from the PPG Corporation.
Glass2 is a clear annealed float glass plate layer, (2.5 mm thick).
Glass3 in a Solex ® solar control glass, (3.0 mm thick).

TABLE 2-continued

Solar Cell Laminate Structures

| Example | Layer 1 | Layer 2 | Layer 3 | Layer 4 | Layer 5 |
| --- | --- | --- | --- | --- | --- |

Ionomer 1 is a 90 mil (2.25 mm) thick embossed sheet of a poly(ethylene-co-methacrylic acid) comprising 18 wt % of polymerized residues of methacrylic acid that is 30% neutralized with zinc ion and having a MI of 1 g/10 minutes (190° C., ISO 1133, ASTM D1238). Ionomer 1 is prepared from a poly(ethylene-co-methacrylic acid) with an MI of 60 g/10 minutes.
Ionomer 2 is a 20 mil (0.51 mm) thick embossed sheet of a poly(ethylene-co-methacrylic acid) comprising 22 wt % of polymerized residues of methacrylic acid that is 26% neutralized with zinc ion and having a MI of 0.75 g/10 minutes (190° C., ISO 1133, ASTM D1238). Ionomer 2 is prepared from a poly(ethylene-co-methacrylic acid) with an MI of 60 g/10 minutes.
PVB is B51V, believed to be a formulated composition based on poly(vinyl butyral) in the form of 20 mil (0.51 mm) thick sheet (a product of the DuPont Corporation).
PVB(A) is an acoustic poly(vinyl butyral) sheet including 100 parts per hundred (pph) poly(vinyl butyral) with a hydroxyl number of 15 plasticized with 48.5 pph plasticizer tetraethylene glycol diheptanoate prepared similarly to those disclosed within PCT Patent Application No. WO 2004/039581.
PVB(m) is a 20 mil (0.51 mm) thick poly(vinyl butyral) sheet prepared from the same composition noted above for PVB(h).
PVB(n) is a 15 mil (0.38 mm) thick poly(vinyl butyral) sheet prepared from the same composition noted above for PVB(i).
Solar Cell 1 is a 10-inch by 10-inch amorphous silicon photovoltaic device comprising a stainless steel substrate (125 micrometers thick) with an amorphous silicon semiconductor layer (U.S. Pat. No. 6,093,581, Example 1).
Solar Cell 2 is a 10-inch by 10-inch copper indium diselenide (CIS) photovoltaic device, (U.S. Pat. No. 6,353,042, column 6, line 19).
Solar Cell 3 is a 10-inch by 10-inch cadmium telluride (CdTe) photovoltaic device (U.S. Pat. No. 6,353,042, column 6, line 49).
Solar Cell 4 is a silicon solar cell made from a 10-inch by 10-inch polycrystalline EFG-grown wafer (U.S. Pat. No. 6,660,930, column 7, line 61).

While certain of the preferred embodiments of the present invention have been described and specifically exemplified above, it is not intended that the invention be limited to such embodiments. Various modifications may be made without departing from the scope and spirit of the present invention, as set forth in the following claims.

What is claimed is:

1. An interlayer sheet comprising a poly(vinyl butyral) composition containing about 20 to about 26 wt % of triethylene glycol di-2-ethylhexanoate plasticizer, wherein a) said interlayer sheet has a pummel value equal to or greater than about 1, a thickness of about 20 to about 30 mils, and a compressive shear strength greater than or equal to about 1000 psi, and b) said interlayer sheet, when laminated with float glass sheets having a thickness of about 2.5 or about 3 mm, provides glass laminates which pass the modified EN 356 P2A test in which a 4.1 kg ball falls from a height of 3 m to strike the air side of the float, glass in an "ATAT" laminate and no penetration is observed after testing 10 (ten) laminate replicates; and which optionally further has one or more characteristics selected from the group consisting of a compressive shear strength of about 1000 to about 2500 psi; a pummel value of about 2 to about 7; an E50 value greater than or equal to 300 psi; and an E120 value of about 8 to about 15 N/mm2.

2. A glass laminate comprising at least one layer of a rigid sheet and at least one layer of the interlayer sheet of claim 1 wherein optionally said at least one rigid sheet is in direct contact with said at least one interlayer sheet of claim 1 or which optionally comprises two layers of rigid sheets that are glass with said at least one interlayer sheet of claim 1 laminated between the glass sheets.

3. A solar cell laminate comprising at least one encapsulant layer and a solar cell layer that comprises one solar cell or a plurality of solar cells that may be electronically interconnected, wherein said at least one encapsulant layer is formed of the interlayer sheet of claim 1 and is laminated to said solar cell layer.

4. The solar cell laminate of claim 3, further comprising a second encapsulant layer that is laminated to an opposite side of said solar cell layer from said at least one encapsulant layer, said second encapsulant layer comprising a composition comprising poly(vinyl butyral) having an E120 of about 8 to about 15 N/mm$^2$ or a composition comprising a material selected from the group consisting of ionomers, poly(ethylene-co-vinyl acetate), acoustic poly(vinyl acetal), acoustic poly(vinyl butyral), poly(vinyl butyral), thermoplastic polyurethane, polyvinylchloride, metallocene-catalyzed linear low density polyethylenes, polyolefin block elastomers, ethylene acrylate ester copolymers, acid copolymers, silicone elastomers and epoxy resins.

5. The solar cell laminate of claim 3, wherein said at least one encapsulant layer is laminated to the light-receiving side of said solar cell layer; or further comprising an incident layer as an outer layer of the laminate on the light-receiving side of said solar cell layer, wherein said incident layer is made of a transparent material, wherein said transparent material is optionally selected from the group consisting of glass and fluoropolymers; or further comprising a backing layer as an outer layer of the laminate on the side of said solar cell laminate that is opposite the light-receiving side, wherein said backing layer is optionally made of a sheet or film selected from the group consisting of glass, plastic sheets or films, and metal sheets or films; or wherein said solar cells are selected from the group consisting of multi-crystalline solar cells, thin film solar cells, compound semiconductor solar cells, and amorphous silicon solar cells.

6. A solar cell laminate consisting essentially of, from top to bottom: (i) an incident layer formed of transparent material, which is laminated to, (ii) a front-sheet encapsulant layer comprising the polymeric interlayer sheet of claim 1, which is laminated to, (iii) a solar cell layer comprising one or a plurality of electronically interconnected solar cells, which is laminated to, (iv) an optional back-sheet encapsulant layer that is laminated to, (v) a backing layer.

7. A process of manufacturing a solar cell laminate comprising: (i) providing an assembly comprising from top to bottom an incident layer, a front-sheet encapsulant layer comprising the interlayer sheet of claim 1, a solar cell layer comprising one solar cell or a plurality of solar cells that may be electronically interconnected, an optional back-sheet encapsulant layer, and a backing layer and (ii) laminating the assembly to form the solar cell laminate; wherein the step (ii) of lamination is optionally conducted by subjecting the assembly to heat; or wherein the step (ii) of lamination is optionally conducted by subjecting the assembly to heat and one or both of pressure and vacuum.

8. The interlayer of claim 1, said interlayer sheet being equilibrated at 30% relative humidity and at about 20° C. to about 25° C. for 24 h to one week prior to measuring the E50 value or the E120 value.

9. The interlayer of claim 1, wherein the poly(vinyl butyral) composition comprises a poly(vinyl butyral) resin comprising, on a weight basis, about 12 to about 23% of hydroxyl groups calculated as polyvinyl alcohol.

10. The interlayer of claim 1, wherein the poly(vinyl butyral) composition comprises a poly(vinyl butyral) resin having 0 to 3% of residual ester groups.

11. The interlayer of claim 1, wherein the poly(vinyl butyral) composition further comprises one or more additives selected from the group consisting of adhesion control additives, surface tension controlling agents, thermal stabilizers, UV absorbers, hindered amine light stabilizers, processing aides, flow enhancing additives, lubricants, pigments, dyes, flame retardants, impact modifiers, nucleating agents, antiblocking agents, UV stabilizers, dispersants, surfactants, chelating agents, coupling agents, adhesives, primers, reinforcement additives and fillers.

12. A glass laminate comprising the interlayer of claim 1, said glass laminate having a construction selected from the group consisting of glass/polymeric sheet; glass/polymeric sheet/film; glass/polymeric sheet/glass; glass/polymeric sheet/film/polymeric sheet/glass; glass/polymeric sheet/film/polymeric sheet/film/polymeric sheet/glass; wherein one or more of the polymeric sheets is the interlayer; and wherein "/" indicates adjacent layers.

13. The glass laminate of claim 2, wherein the rigid sheet is selected from the group consisting of glasses, polycarbonates, acrylics, polyacrylates, cyclic polyolefins, metallocene-catalyzed polystyrenes, polyamides, polyesters, fluoropolymers, metal sheets and ceramic plates.

14. The glass laminate of claim 12 that comprises two or more polymeric sheets, wherein a polymeric sheet that is not the interlayer comprises a material selected from the group consisting of ethylene acid copolymers and ionomers, poly(ethylene-co-vinyl acetate)s, acoustic poly(vinyl acetal)s, poly(vinyl butyral)s, polyurethanes, polyvinylchlorides, metallocene-catalyzed linear low density polyethylenes, polyolefin block elastomers, ethylene acrylate ester copolymers, silicone elastomers and epoxy resins.

15. The glass laminate of claim 12, wherein the total thickness of the polymeric sheets comprising poly(vinyl butyral) is greater than or equal to about 30 mils (0.76 mm).

16. The glass laminate of claim 12, wherein the glass is selected from the group consisting of window glass, plate glass, silicate glass, sheet glass, low iron glass, tempered glass, tempered CeO-free glass, float glass, colored glass, and specialty glass, said specialty glass selected from the group consisting of glass comprising ingredients to control solar heating, glass coated with sputtered metals, and E-glass.

17. The glass laminate of claim 12, wherein the film(s) are selected from the group consisting of metal foils, polyesters, polycarbonates, polypropylenes, polyethylenes, polypropylenes, cyclic polyloefins, norbornene polymers, polystyrenes, syndiotactic polystyrenes, styrene-acrylate copolymers, acrylonitrile-styrene copolymers, poly(ethylene naphthalate)s, polyethersulfones, polysulfones, nylons, poly(urethanes), acrylics, cellulose acetates, cellulose triacetates, cellophanes, vinyl chloride polymers, polyvinylidene chlorides, vinylidene chloride copolymers, fluoropolymers, polyvinyl fluoride, polyvinylidene fluoride, polytetrafluoroethylene, ethylene-tetrafluoroethylene copolymers.

18. The glass laminate of claim 12, wherein one or more of the glass layer(s), the interlayer, the polymeric sheet(s) that are not the interlayer, and the film(s) are treated with one or more adhesion-enhancing treatments selected from the group consisting of adhesives, primers, flame treatments, plasma treatments, electron beam treatments, oxidation treatments, corona discharge treatments, other chemical treatments, chromic acid treatments, hot air treatments, ozone treatments, ultraviolet light treatments, sand blast treatments and solvent treatments.

19. The glass laminate of claim 12, wherein the interlayer has a pummel value of about 2 to about 7 and a compressive shear strength of about 1000 to about 2500 psi.

20. The glass laminate of claim 12, having one or more edges that are sealed with a sealing material selected from the group consisting of butyl rubbers, polysulfides, silicones, polyurethanes, polypropylene elastomers, polystyrene elastomers, block elastomers and styrene-ethylene-butylene-styrene (SEBS) copolymers.

21. The glass laminate of claim 17, wherein at least one of the films is a multilayer film selected from the group consisting of fluoropolymer/polyester bilayer film and fluoropolymer/polyester/fluoropolymer trilayer film, or wherein at least one of the films is a biaxially oriented poly(ethylene terephthalate) film.

22. The glass laminate of claim 17, wherein the film or at least one of the films is coated with an organic infrared absorber, a sputtered metal layer or a metal oxide coating.

23. The glass laminate of claim 18, wherein the adhesion-enhancing treatments are selected from the group consisting of a thin layer of vacuum-sputtered carbon, a hydroxy-acrylic hydrosol primer coating, and an adhesive or primer that is a silane incorporating an amine function.

24. The glass laminate of claim 18, wherein the film(s) are coated on one or both surfaces with a polyallylamine-based primer.

* * * * *